United States Patent [19]
Goldberg

[11] Patent Number: 4,489,363
[45] Date of Patent: Dec. 18, 1984

[54] APPARATUS FOR COOLING INTEGRATED CIRCUIT CHIPS

[75] Inventor: Norman Goldberg, Dresher, Pa.

[73] Assignee: Sperry Corporation, New York, N.Y.

[21] Appl. No.: 462,275

[22] Filed: Jan. 31, 1983

[51] Int. Cl.³ .............................................. H05K 7/20
[52] U.S. Cl. .................................. 361/383; 174/16 R
[58] Field of Search ............... 361/380, 381, 382, 383, 361/384, 385, 386, 387, 395, 399, 413, 415; 174/15 R, 16 HS, 16 R; 165/122, 124, 126; 357/81

[56] References Cited

U.S. PATENT DOCUMENTS

| | | | |
|---|---|---|---|
| 3,163,207 | 12/1964 | Schultz | 165/80 B |
| 3,264,534 | 8/1966 | Murphy | 165/80 B |
| 3,416,597 | 12/1968 | Kupferberg | 165/80 |
| 3,457,988 | 7/1969 | Meyerhoff et al. | 165/80 |
| 3,788,393 | 1/1974 | Plizak | 174/15 R |
| 3,790,859 | 2/1974 | Schraeder et al. | 361/384 |
| 3,909,679 | 9/1975 | Petri | 361/388 |
| 4,341,432 | 7/1982 | Cutchaw | 361/385 |

OTHER PUBLICATIONS

Tuckerman et al., "High-Performance Heat Sinking for VLSI", IEEE Electron Device Letters, vol. 2 EDL-2, No. 5, 5/81.
Dumaine et al., "IBM Technical Disclosure Bulletin", vol. 20, No. 4, 9/77, p. 1472.
Archey, "IBM Technical Disclosure Bulletin", vol. 19, No. 2, 7/76, p. 412.
Tiffany, "IBM Technical Disclosure Bulletin", vol. 13, No. 1, 6/70, p. 58.

Primary Examiner—A. D. Pellinen
Assistant Examiner—Gregory D. Thompson
Attorney, Agent, or Firm—James R. Bell; Thomas J. Scott; Marshall M. Truex

[57] ABSTRACT

Apparatus is provided for cooling a closely grouped plurality of integrated circuit chips by forced air convection. A heat sink, having a plurality of fins and a narrow channel between each fin, is connected to a first side of a substrate and has one end protruding into an aperture in the substrate. A chip is connected directly to the one end of the sink and is electrically connected to a second side of the substrate.

3 Claims, 4 Drawing Figures

APPARATUS FOR COOLING INTEGRATED CIRCUIT CHIPS

BACKGROUND OF THE INVENTION

1. Field of the Invention

This invention relates generally to heat exchange of an electrical article and more particularly to cooling an integrated circuit chip.

2. Description of the Prior Art

The temperature of integrated circuit chips must be kept below specified limits to ensure proper function, reliability and useful life. The trend in integrated circuit technology is toward large scale integration which results in increased functions per chip. Also, system designers are mounting chips closer together to minimize propagation delays in the circuit interconnections. As a result of the foregoing, heat is not only increased for each chip but is also concentrated due to the closely mounted chips. Cooling of these chips is a problem.

A limitation of chip cooling is that compact areas are often too confining to provide adequate cooling. The prior art discloses that liquid cooling promises to be more compact than forced air convection. However, limitations to liquid cooling include increased cost due to complexity of cooling circuits, i.e. pumping and guiding liquid to and from the vicinity of the chips and cooling the fluid so that it can be recirculated in a closed loop system. Also, there is an inherent aversion to using a liquid within an electrical system due to the obvious problems created if leakage of the liquid should occur.

A heat sink having narrow air channels formed between adjacent fins has been mounted on one side of a board or substrate adjacent a respective chip which is mounted on an opposite side of the board. Heat from the chip is conducted through the substrate to the sink. Air moved through the channels and across the fins carries heat from the sink by convection. Heat conducted through substrate encounters the thermal resistance of the board.

The foregoing illustrates limitations of the known prior art. Thus, it is apparent that it would be advantageous to provide an alternative directed to overcoming one or more of the limitations as set forth above. Accordingly, a suitable alternative is provided including features more fully disclosed hereinafter.

SUMMARY OF THE INVENTION

In one aspect of the present invention, this is accomplished by providing an apparatus for cooling integrated circuit chips including a substrate having an aperture formed therein. A heat sink has an integrated circuit chip connected to one end. The sink is then mounted on a first side of the substrate. The one end of the heat sink having the chip, extends into the aperture adjacent a second side of the substrate. The chip is electrically connected to the second side of the substrate.

The foregoing and other aspects will become apparent from the following detailed description of the invention when considered in conjunction with the accompanying drawings. It is to be expressly understood, however, that the drawings are not intended as a definition of the invention but are for the purpose of illustration only.

DESCRIPTION OF THE PREFERRED EMBODIMENT

Figure 1:
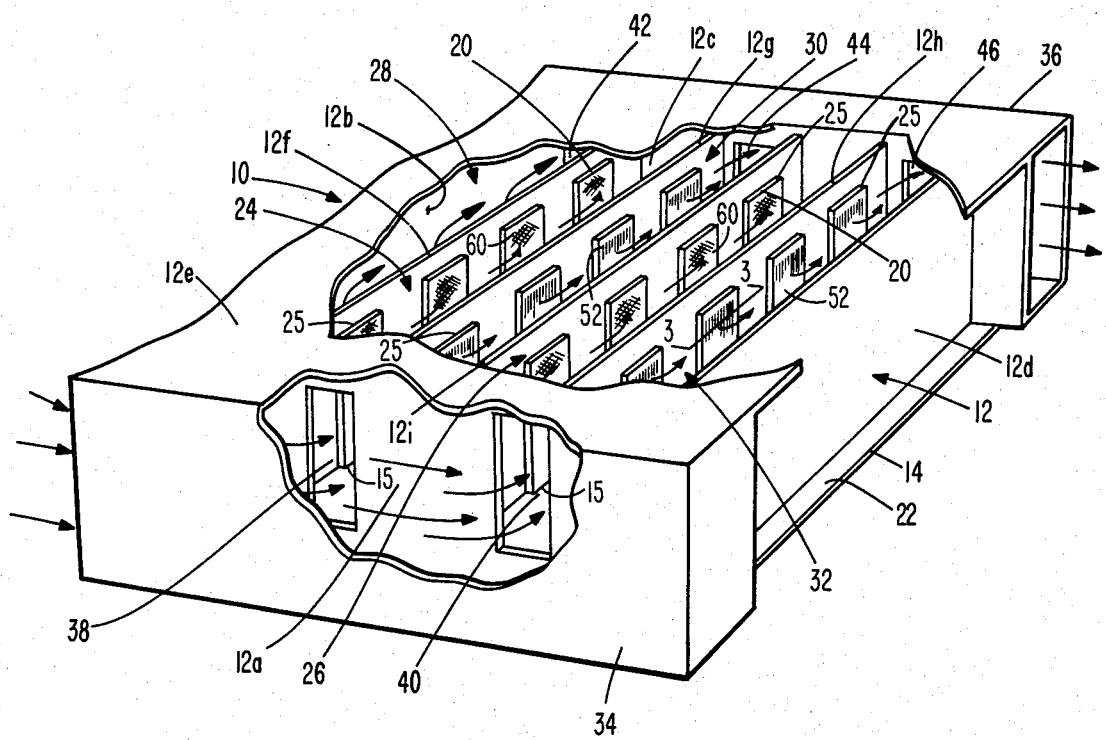
FIG. 1 is an isometric view illustrating an embodiment of the apparatus of this invention.
Figure 2:
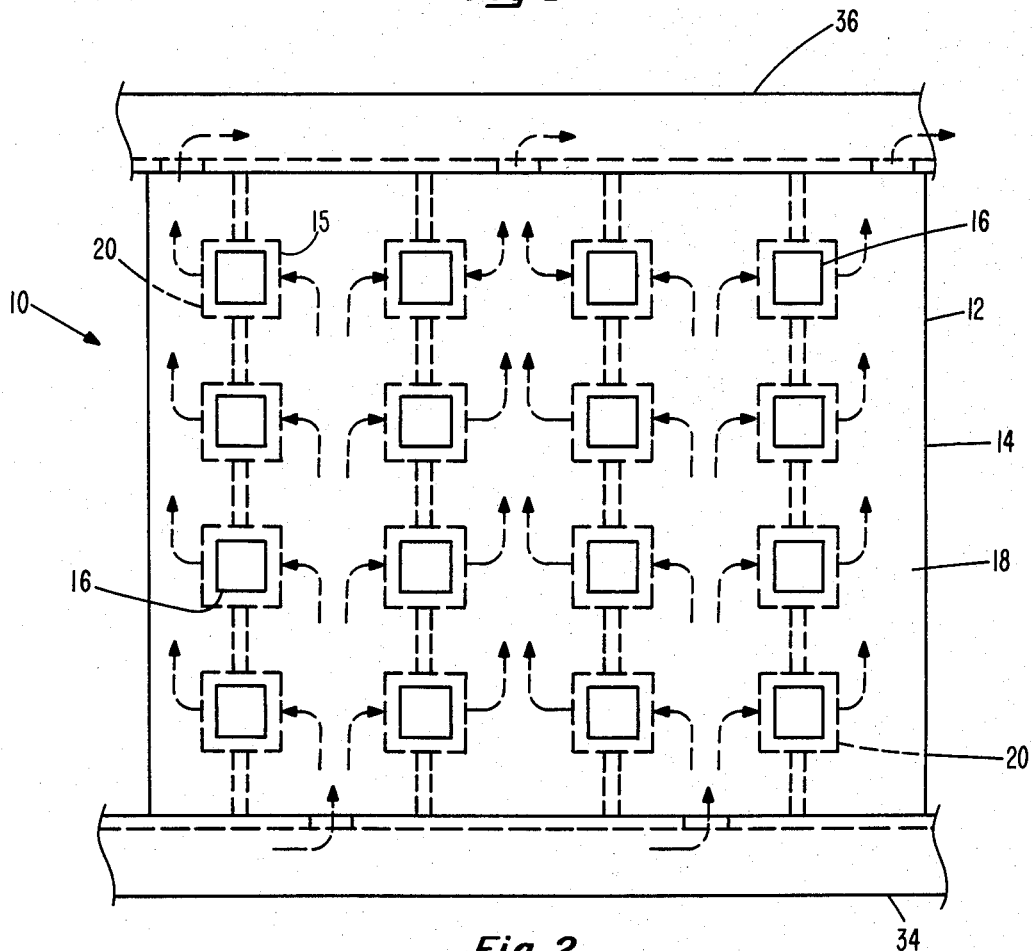
FIG. 2 is a plan view of the underside of substrate 14.
Figure 3:
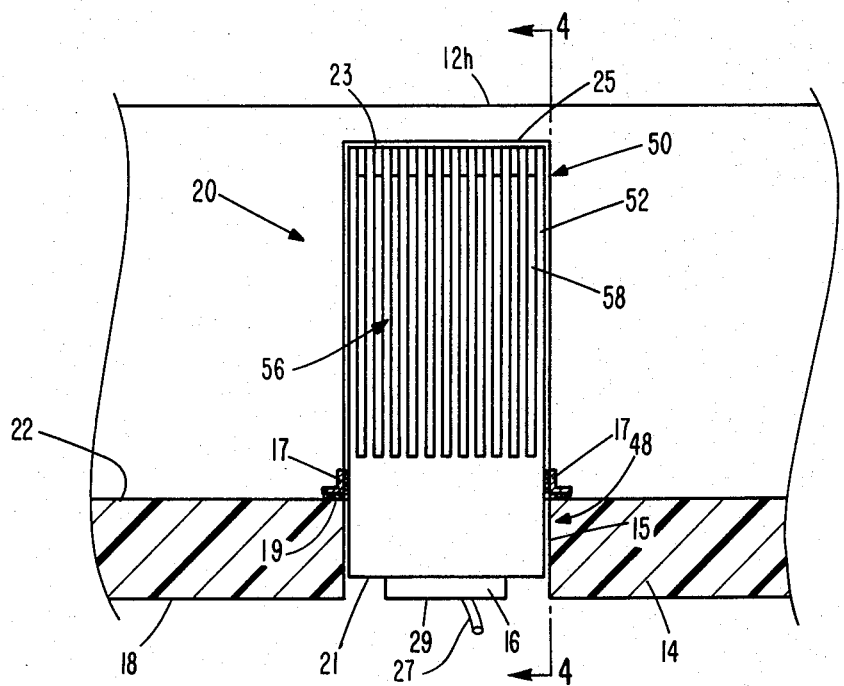
FIG. 3 is an exploded elevational view graphically illustrating an embodiment of the outlet side of the heat sink of this invention taken along line 3—3 of FIG. 1.
Figure 4:
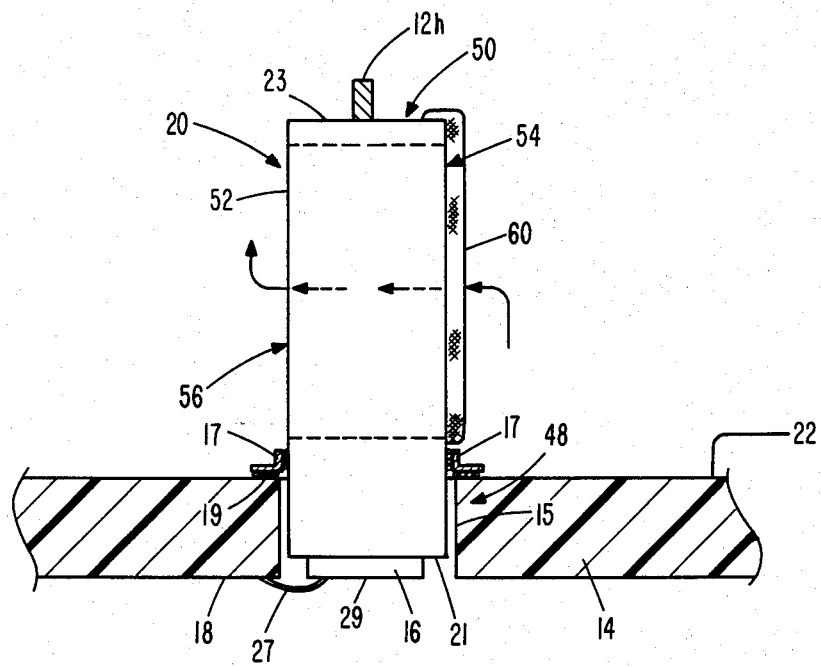
FIG. 4 is a view taken along line 4—4 of FIG. 3.

In FIGS. 1–4, a modular apparatus for cooling integrated circuit chips is generally designated 10 and comprises a housing 12 including a well-known ceramic substrate 14, typically alumina, having a plurality of apertures 15 formed therein. A plurality of heat sinks 20 are each mounted in a respective aperture of substrate 14 by means of a flange 17 connected to a surface 22 of substrate 14 and also connected to sink 20. Flange 17 is provided so as to position a gold-plated end 21 of sink 20 adjacent a surface 18 of substrate 14. In this manner an integrated circuit chip 16, bonded directly to end 21 of sink 20, preferably by a Silicon-Gold eutectic bond, is positioned adjacent surface 18 of substrate 14. Another end 23 of each sink 20 protrudes substantially from substrate 14 and includes fins forming narrow channels therebetween sufficient for permitting fluid to flow through sink 20.

Housing, or plenum 12 is of aluminum or plastic and includes a plurality of sides 12a, 12b, 12c and 12d, and a top 12e. Housing 12 and substrate 14 are connected so that substrate 14 forms a bottom of housing 12. Also included in housing 12 are a plurality of partitions 12f, 12g, 12i and 12h defining a plurality of separated inlet chambers 24, 26 and a plurality of separated outlet chambers 28, 30 and 32. An exemplary fluid conduit 34 is connected to side 12a and a similar fluid conduit 36 is connected to side 12c. Conduit 34 is provided for conducting a fluid, preferably air under pressure, to inlet chambers 24, 26 via a plurality of inlet ports 38, 40, whereas conduit 36 is provided for conducting the fluid from outlet chambers 28, 30, 32 via a plurality of outlet ports 42, 44 and 46. Partitions 12f, 12g, 12i and 12h include openings 25 sufficient to receive end 23 of each sink 20.

Each heat sink 20 is formed of flat pieces of Copper and preferably of Copper Alloy No. 110 distributed by North America Brass and Aluminum, Inc. The nearest applicable ASTM specifications for flat No. 110 Copper alloy are B11, B48, B101, B124, B133, B152, B187, B272 and B370. Flat pieces of Copper alloy No. 110 having thicknesses of 0.025", 0.010" and 0.005" were used to form fabricated sinks 20.

Each sink 20 includes a base 48 and a top 50 and has a plurality of substantially parallel, elongated fins 52 extending from base 48 to top 50 and also extending from an inlet side 54 to an outlet side 56. Each sink 20 is mounted in one of the partitions 12f, 12g, 12i and 12h exposing inlet side 54 to one of the inlet chambers 24, 26 and exposing outlet side 56 to one of the outlet chambers 28, 30 and 32.

Fabricating sinks 20 can be accomplished by selecting flat pieces of copper alloy No. 110 and welding together a plurality of fins 52 at base 48 and top 50 by the well known tig welding method. Fins 52 are each separated at base 48 by a piece of flat Copper alloy No. 110 having the same thickness as each fin 52. Similarly, fins 52 are each separated at top 50 by a piece of flat Copper alloy 110 having the same thickness as each fin 52. In this manner, for example, a sink 20 having fins 52 of a 0.025" thickness define a narrow gap or channel 58 between each adjacent fin 52 also having a thickness of 0.025". Similarly, a sink having fins 0.010" thick has gaps of 0.010" thick, and a sink having fins 0.005" thick has gaps of 0.005" thick, and so on.

Flange 17 is formed of a suitable material and is connected to sink 20 and to surface 22 of substrate 14 by a suitable epoxy 19. Chip 16 is electrically connected by means 27, such as wire bonding or tape automated bonding, to surface 18 of substrate 14.

Means, such as a mesh covering 60, can be provided to cover inlet side 54 of each sink 20. In this manner, sufficient resistance is provided to permit a substantially equal rate of fluid to flow though each sink 20 from inlet chambers 24, 26 through channels 58 between fins 52 and into outlet chambers 28, 30, 32. Thus, mesh cover 60 causes fluid pressure to be increased in inlet chambers 24, 26 during operation. A typical mesh cover 60 is a screen formed of 316 stainless steel having an 80×80 mesh of 0.007" wire distributed by Newark Wire Cloth Company.

In accordance with this invention, heat sinks having fins of a 0.010" thickness and gaps therebetween also of a 0.010" thickness were tested on a substrate with 16 chips on ⅛" centers. This arrangement provided adequate cooling for chips running at 10 watts each with an air flow of 20 liters per minute, per sink. An air pressure of 10.5 inches of water was required. The thermal resistance of this arrangement was 5° C./watt from junction to ambient air. This corresponds to a power density of 40 watts per square inch. Prior to this invention, it was felt that such high power densities required liquid cooling.

The performance of a heat sink is usually described by its thermal resistance; the increase in temperature per unit of dissipated power. One of the most significant contributions to this resistance is at the surface of the sink where heat is transferred to the coolant fluid. Previous heat sink designers recognized that this resistance can be reduced by increasing the area of the sink and therefore the use of fins is common in heat sinks. However, previous forced air heat sink designers did not recognize, the possibility of increasing the heat transfer coefficient between the sink and the fluid. This can be done by using very narrow channels or gaps between the fins. With a short distance between the fin and the center of the gap, the temperature gradient is larger, and therefore the heat transfer coefficient is larger.

During manufacture, each integrated circuit chip 16 is first attached to one end 21 of each sink 20 by a eutectic bond which requires high heat. It is important to accomplish this bond prior to mounting the sink 20 on the substrate 14 as this advantageously avoids exposing the substrate 14 to high heat. Also, each sink/chip combination can be tested prior to mounting on the substrate.

After bonding and/or testing the sink 20 is then mounted on one side 22 of the substrate 14 so that the chip 20 extends into the aperture 15 formed in the substrate 14, and a surface 29 of chip 20 is substantially flush with surface 18 of substrate 14. Chip 20 is then electrically connected to surface 18 of substrate 14 by means of well-known wires or tape 27. It is advantageous to have chip surface 29 and substrate surface 18 substantially flush as this avoids under flexing of wire or tape 27.

The foregoing has described a narrow channeled forced air heat sink capable of providing adequate cooling of a compact concentration of integrated circuit chips. Each chip 16 is connected directly to each respective sink 20 thereby avoiding the thermal resistance of substrate 14.

It is anticipated that aspects of the present invention, other than those specifically defined in the appended claims, can be obtained from the foregoing description and the drawings.

Having thus described the invention, what is claimed is:

1. An apparatus for cooling integrated circuit chips comprising:
   a housing including a substrate, said substrate having apertures formed therethrough, said housing also including a partition mounted therein defining an inlet chamber and an outlet chamber, said partition having a plurality of openings formed therethrough;
   a plurality of heat sinks mounted on said substrate, each heat sink having a first end extending into a respective one of said apertures;
   each of said sinks having a second end extending into a respective one of said openings in said partition and having an inlet side of each sink exposed to said inlet chamber and having an outlet side of each sink exposed to said outlet chamber;
   a fluid inlet and a fluid outlet in said housing, each inlet side being connected for conducting fluid from said inlet chamber and each outlet side being connected for conducting fluid to said outlet chamber;
   each heat sink further having a plurality of elongated spaces formed therethrough for defining a plurality of spaced apart fins for permitting fluid to flow through said heat sink from said inlet side to said outlet side; and
   means covering each inlet side for resisting fluid flow between the fins.

2. The apparatus of claim 1 including:
   a chip connected directly to said first end of said heat sink.

3. The apparatus of claim 1 including:
   a flange interconnecting each heat sink and said substrate.

* * * * *